United States Patent
Ng et al.

(10) Patent No.: US 11,990,422 B2
(45) Date of Patent: May 21, 2024

(54) FERRITE ELECTRO-MAGNETIC INTERFERENCE (EMI) SHIELD BETWEEN AN INTEGRATED-CIRCUIT (IC) CHIP AND AN AIR-CORE INDUCTOR ALL INSIDE A HYBRID LEAD-FRAME PACKAGE

(71) Applicant: High Tech Technology Limited, Hong Kong (HK)

(72) Inventors: Chik Wai (David) Ng, Hong Kong (HK); Kwun Yuan (Godwin) Ho, Hong Kong (HK); Ki Hin (Gary) Choi, Hong Kong (HK); Tin Ho (Andy) Wu, Hong Kong (HK); Wai Kit (Victor) So, Hong Kong (HK)

(73) Assignee: High Tech Technology Limited, Hong Kong (HK)

( * ) Notice: Subject to any disclaimer, the term of this patent is extended or adjusted under 35 U.S.C. 154(b) by 320 days.

(21) Appl. No.: 17/693,566

(22) Filed: Mar. 14, 2022

(65) Prior Publication Data
US 2023/0290735 A1   Sep. 14, 2023

(51) Int. Cl.
*H01L 23/64* (2006.01)
*H01L 23/00* (2006.01)
(Continued)

(52) U.S. Cl.
CPC ...... *H01L 23/552* (2013.01); *H01L 23/49861* (2013.01); *H01L 23/645* (2013.01);
(Continued)

(58) Field of Classification Search
CPC ....... H01L 23/645; H01L 23/64; H01L 23/60; H01L 23/58; H01L 23/585
See application file for complete search history.

(56) References Cited

U.S. PATENT DOCUMENTS

| 5,428,245 A | 6/1995 | Lin et al. |
| 6,501,364 B1 | 12/2002 | Hui et al. |

(Continued)

FOREIGN PATENT DOCUMENTS

| CN | 101064208 A | 10/2007 |
| CN | 103247596 A | 8/2013 |

(Continued)

OTHER PUBLICATIONS

Mohan, M. del Mar Hershenson, S. P. Boyd and T. H. Lee, "Simple accurate expressions for planar spiral inductances", IEEE Journal of Solid-State Circuits, vol. 34, No. 10, pp. 1419-1424, Oct. 1999.

*Primary Examiner* — Errol V Fernandes
(74) *Attorney, Agent, or Firm* — gPatent LLC; Stuart T. Auvinen

(57) ABSTRACT

An Integrated Circuit (IC) package has a ferrite-dielectric shield between a planar inductor coil and a semiconductor chip. The shield blocks Electro-Magnetic Interference (EMI) generated by currents in the inductor coil from reaching the semiconductor chip. The shield has a ferrite layer surrounded by upper and lower dielectric laminate layers to prevent electrical shorts. The center end of the inductor coil connects to the semiconductor chip through a center post that fits through an opening in the shield that is over the air core center of the inductor coil. The center post can connect to a die attach pad that the semiconductor chip is mounted to. Bonding wires connect pads on the semiconductor chip to lead-frame pads on lead-frame risers that end at external package connectors. The outer end of the inductor coil connects to lead-frame outer risers also having external package connectors such as pins or bonding balls.

20 Claims, 13 Drawing Sheets

(51) Int. Cl.
*H01L 23/498* (2006.01)
*H01L 23/552* (2006.01)

(52) U.S. Cl.
CPC .............. *H01L 24/16* (2013.01); *H01L 24/48* (2013.01); *H01L 2224/16221* (2013.01); *H01L 2224/48249* (2013.01); *H01L 2224/48257* (2013.01); *H01L 2924/182* (2013.01); *H01L 2924/3025* (2013.01)

(56) References Cited

U.S. PATENT DOCUMENTS

| | | | |
|---|---|---|---|
| 9,001,524 B1 | 4/2015 | Akre | |
| 2001/0024739 A1* | 9/2001 | Mizoguchi | H01F 27/292 |
| | | | 428/606 |
| 2008/0238599 A1* | 10/2008 | Hebert | H01L 23/645 |
| | | | 336/232 |
| 2016/0172310 A1* | 6/2016 | Zhai | H01L 23/552 |
| | | | 257/659 |
| 2020/0227349 A1 | 7/2020 | Zhai | |
| 2024/0079172 A1* | 3/2024 | Ishii | H01F 10/20 |

FOREIGN PATENT DOCUMENTS

| | | |
|---|---|---|
| EP | 0707743 B1 | 7/1999 |
| WO | WO1998028637 A2 | 7/1998 |

* cited by examiner

FERRITE ELECTRO-MAGNETIC INTERFERENCE (EMI) SHIELD BETWEEN AN INTEGRATED-CIRCUIT (IC) CHIP AND AN AIR-CORE INDUCTOR ALL INSIDE A HYBRID LEAD-FRAME PACKAGE

FIELD OF THE INVENTION

This invention relates to semiconductor-inductor packages, and more particularly to a package with a semiconductor chip shielded from an integrated inductor.

BACKGROUND OF THE INVENTION

Semiconductor chips are widely used and are often packaged in a lead-frame plastic package. Bonding wires are placed between bonding pads on the semiconductor chip and bonding pads on the lead frame. Then the lead frame and chip are encapsulated with plastic that covers and protects the bonding wires as well as the chip and lead frame. Ends of the lead frame protrude from the plastic to form pins. An electrical path is provide from the pins, through the lead frame to the lead-frame bonding pad, through the bonding wires and to the bonding pads on the chip.

While transistors, resistors, and capacitors are easily integrated together in the semiconductor chip using technologies such as Complementary Metal-Oxide-Semiconductor (CMOS) processes, inductors are not since inductance values would be too small or the area penalty too high.

External inductors are often used. Typically metal wires are wrapped many times around a metal core. Air core inductors have a lower inductance than metal-core inductors, but are easier to make. An air core inductor may be formed by a small, flat spiral coil. This planar inductor would have a low energy loss and be useful for high frequency switching, but the inductance would be too low for some applications such as power converters.

Such a planar air-core inductor might physically be able to be integrated with a semiconductor chip, perhaps in a single package. However, the inductor coil produces an electro-magnetic field that can induce currents in nearby metal wires. When the inductor is placed near a semiconductor chip, the electromagnetic field can induce unwanted currents in metal traces in the semiconductor chip. These unwanted currents can interfere with desired signals and cause the semiconductor chip to operate improperly. For higher inductances and coil currents, and close spacings to the chip, the inducted currents in the chip could even damage the chip. Thus such Electro-Magnetic Interference (EMI) generated by the coil can prevent integration with a chip in a semiconductor package.

The package can be made larger so that the semiconductor chip and the inductor are spaced apart far enough that the EMI does not harm the semiconductor chip. However, this spacing may be several times the size of the indictor or chip. The package would have to be many times larger than is desirable.

Multi-chip modules might be able to have an integrated inductor, but these modules are many times larger than a single-chip package. Such large modules are costly and take up too much area on a Printed Circuit Board (PCB) that they would be mounted to. Certain applications such as Internet-of-Things (IoT) are area and cost constrained, preventing the use of large packages.

What is desired is a semiconductor package containing both a semiconductor chip and an inductor. It is desired to shield the semiconductor chip from the EMI generated by the coil. It is further desired to boost the inductance of the coil. It is desired to add a structure to a semiconductor package that both shields the chip from EMI and boosts the inductance of the inductor.

DETAILED DESCRIPTION

The present invention relates to an improvement in semiconductor-inductor packaging. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
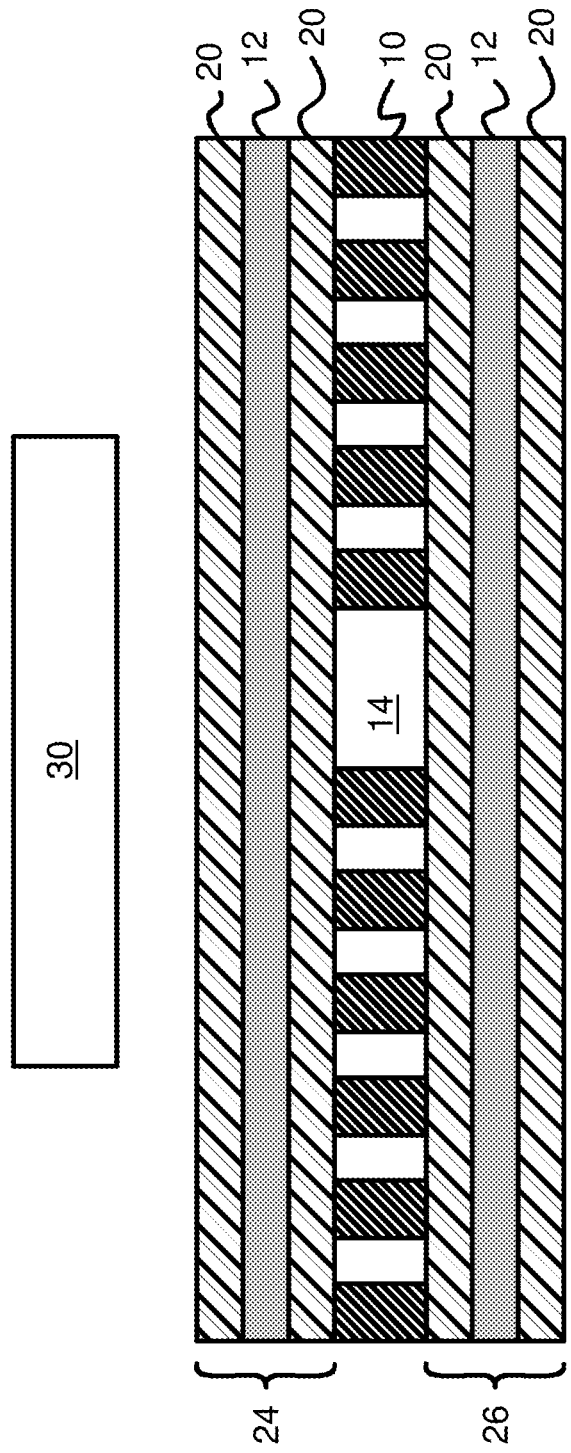
FIG. 1 is a simplified cross-section of a shielded-inductor semiconductor package.

FIG. 1 is a simplified cross-section of a shielded-inductor semiconductor package. Semiconductor chip 30 and inductor coil 10 are integrated together in a package (not shown). Inductor coil 10 has air core 14 at its center and has spirals out of the plane of FIG. 1. Although this cross-section shows breaks in inductor coil 10, inductor coil 10 is actually one continuous coil perpendicular to the plane of FIG. 1.

When current is passed through inductor coil 10, an Electro-Magnetic field is generated which could cause Electro-Magnetic Interference (EMI) in semiconductor chip 30. However, upper ferrite-dielectric shield 24 is placed over inductor coil 10, between inductor coil 10 and semiconductor chip 30. Upper ferrite-dielectric shield 24 contains ferrite layer 12 that is sandwiched by dielectric laminate layers 20 on its top and bottom.

Ferrite layer 12 is a ceramic layer that contains magnetized iron or ferrite metal particles, such as Manganese-zinc ferrite (MnZn, with the formula $Mn_aZn_{(1-a)}Fe_2O_4$), or Nickel-zinc ferrite (NiZn, with the formula $Ni_aZn_{(1-a)}Fe_2O_4$ Dielectric laminate layers 20 can be a plastic laminate or other insulator, such as FR4 or PI, which are NEMA grade designations for glass-reinforced epoxy laminate material. FR-4 is a composite material composed of woven fiberglass cloth with an epoxy resin binder that is flame resistant (self-extinguishing). PI is a polyimide, which is a polymer of imide monomers belonging to the class of high performance plastics. A classic polyimide is Kapton, which is produced by condensation of pyromellitic dianhydride and 4,4'-oxydianiline. Upper ferrite-dielectric shield 24 can be made as sheets of ferrite layer 12 covered on the top and bottom by dielectric laminate layers 20 that can be cut to size as needed.

A second shield is provided by lower ferrite-dielectric shield 26 to prevent EMF from escaping from the bottom of inductor coil 10 and possibly looping around the edges of upper ferrite-dielectric shield 24 to reach semiconductor chip 30. Since inductor coil 10 is sandwiched by upper ferrite-dielectric shield 24 and lower ferrite-dielectric shield 26, the electro-magnetic field generated by inductor coil 10 is limited to a small region between ferrite layers 12 in upper ferrite-dielectric shield 24 and lower ferrite-dielectric shield 26.

This limiting of the electro-magnetic field by ferrite layers 12 also increases the inductance of inductor coil 10. Even through inductor coil 10 is an air-core inductor since the center of inductor coil 10 is air core 14, the presence of ferrite layer 12 above and below the plane of inductor coil 10 acts to increase its inductance.

Upper ferrite-dielectric shield 24 can touch the top of inductor coil 10 since dielectric laminate layers 20 prevents electrical shorting between inductor coil 10 and ferrite layer 12. Thus ferrite layers 12 may be placed very close to inductor coil 10. The thickness of dielectric laminate layers 20 may be only 0.1 mm, so the electromagnetic field can be very tightly restricted. This tight spacing and restriction of the electromagnetic field can further intensify the inductance of inductor coil 10. Although being an air-core inductor, inductor coil 10 surrounded by ferrite-dielectric shields 24, 26 can have a respectable inductance value approaching that of a magnetic-core inductor.

Figure 2A:
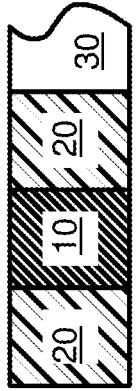
FIGS. 2A, 2B, 2C show a graph of electromagnetic field strength across the cross-section of the shielded-inductor semiconductor package of FIG. 1.
Figure 2B:
Figure 2C:
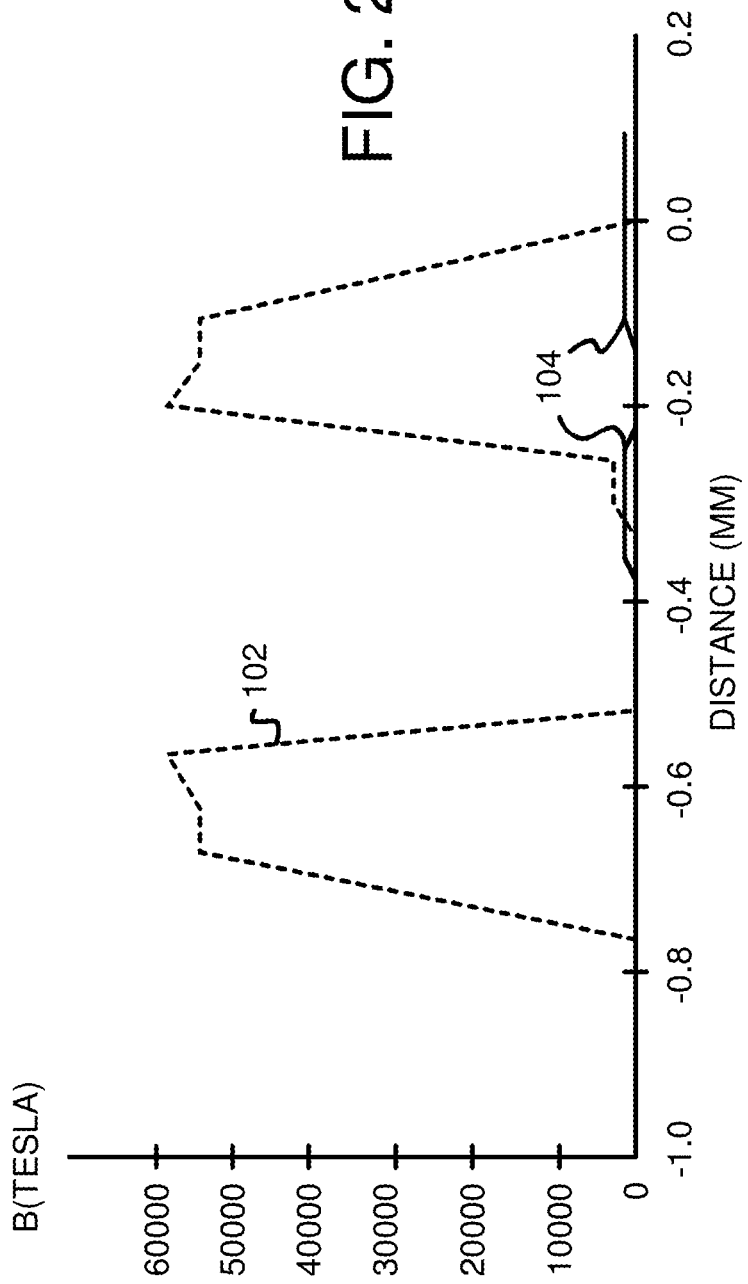

FIGS. 2A, 2B, 2C show a graph of electromagnetic field strength across the cross-section of the shielded-inductor semiconductor package of FIG. 1. When an alternating current is passed through inductor coil 10, a time-varying electromagnetic field is generated. When ferrite layer 12 is not present, as in FIG. 2A, the strength of this electromagnetic field is as shown by curve 104 in FIG. 2C.

The presence of ferrite layer 12 in FIG. 2B causes the electromagnetic field to be concentrated within ferrite layer 12, and to drop rapidly within dielectric laminate layers 20 that surround each ferrite layer 12. Curve 102 in FIG. 2C shows that the drop-off in electromagnetic field strength is so rapid that the electromagnetic field is close to zero outside of dielectric laminate layers 20 and ferrite layer 12 that are each 0.1 mm in thickness. Near semiconductor chip 30, the electromagnetic field with ferrite layer 12, shown by curve 102, is much smaller than the electromagnetic field without ferrite layer 12, shown by curve 104.

While the spikes of the electromagnetic field within ferrite layer 12 are large, as shown by curve 102, these spikes provide lower electromagnetic field strength outside of dielectric laminate layers 20, such as near the surface of semiconductor chip 30. Thus EMI is reduced at chip semiconductor chip 30 due to ferrite layer 12.

In simulations, the electromagnetic field strength at the surface of semiconductor chip 30 (distance 0.0) at a point about 10 mm off center of air core 14 (z direction in FIG. 2) and 0.1 mm above the top of upper ferrite-dielectric shield 24 is 967 µT when ferrite layer 12 is not present, but only 0.523 µT when ferrite layer 12 is present.

Thus ferrite layer 12 decreases the electromagnetic field seen by semiconductor chip 30 by roughly a factor of 2,000.

Figure 3:
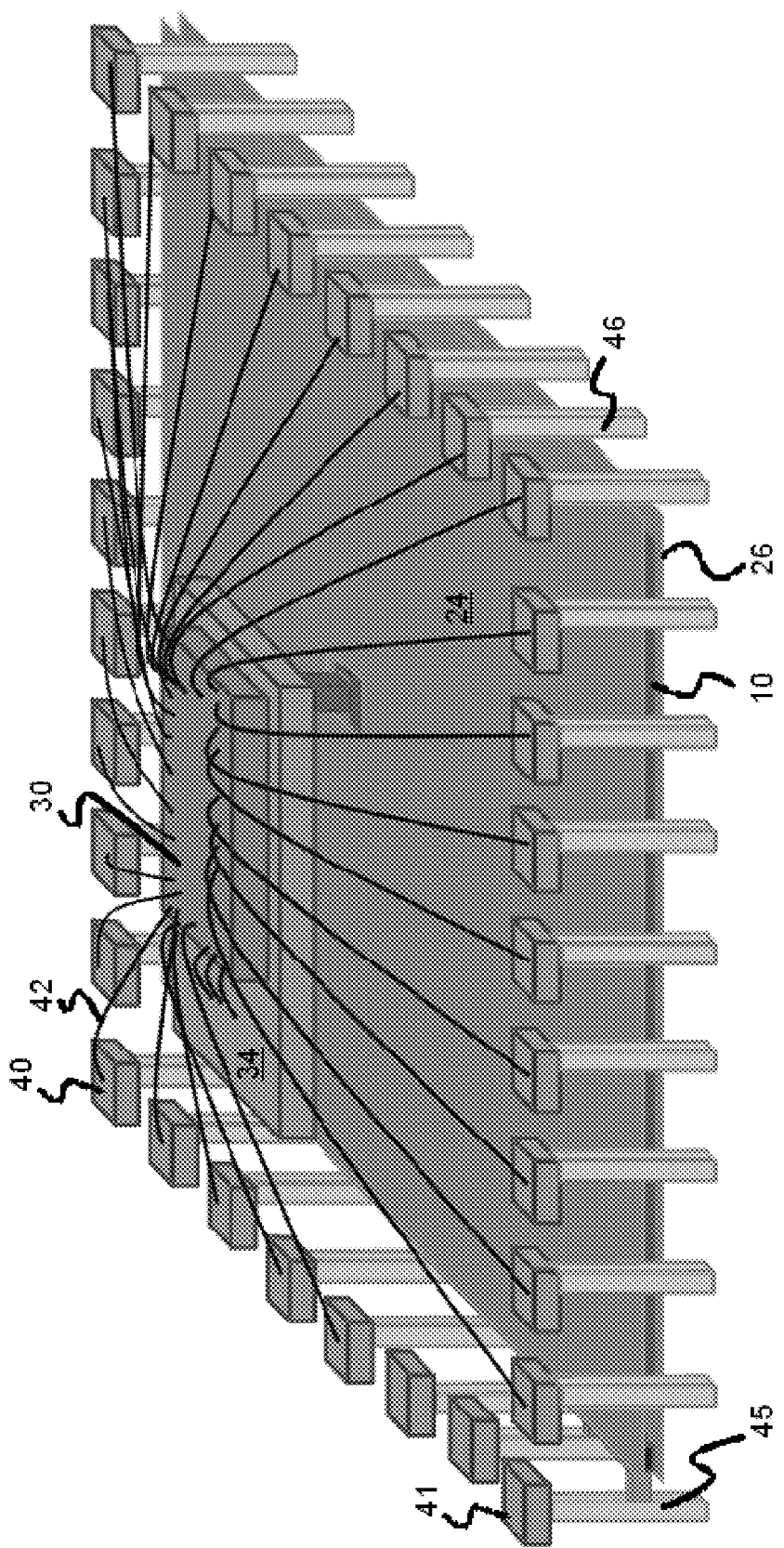
FIG. 3 is a 3D diagram of a shielded-inductor semiconductor package.

FIG. 3 is a 3D diagram of a shielded-inductor semiconductor package. Semiconductor chip 30 is attached to die attach pad 34 such as by epoxy or other bonding. Bonding wires 42 are routed between bonding pads on semiconductor chip 30 and lead-frame pads 40. A few bonding wires are routed from bonding pads on semiconductor chip 30 to die attach pad 34.

Lead-frame pads 40, 41 sit atop lead-frame risers 46, 45 that connect to package pins that protrude out the bottom of the package and can fit in holes in a PCB when being soldered to the PCB of the larger system. Lead-frame risers 46 may be bent or connect to other parts of the lead frame (not shown) that lead to the external package pins, bonding balls, or other external connectors (not shown).

Lead-frame risers 45, 46 form a rectangle that surrounds semiconductor chip 30, die attach pad 34, and inductor coil 10, which is mostly hidden from view by upper ferrite-dielectric shield 24. Inductor coil 10 is covered on the top by upper ferrite-dielectric shield 24 and on the bottom by lower ferrite-dielectric shield 26. Depending on the inductance value desired, the area of inductor coil 10 can be larger than that of die attach pad 34 and semiconductor chip 30.

Figure 4:
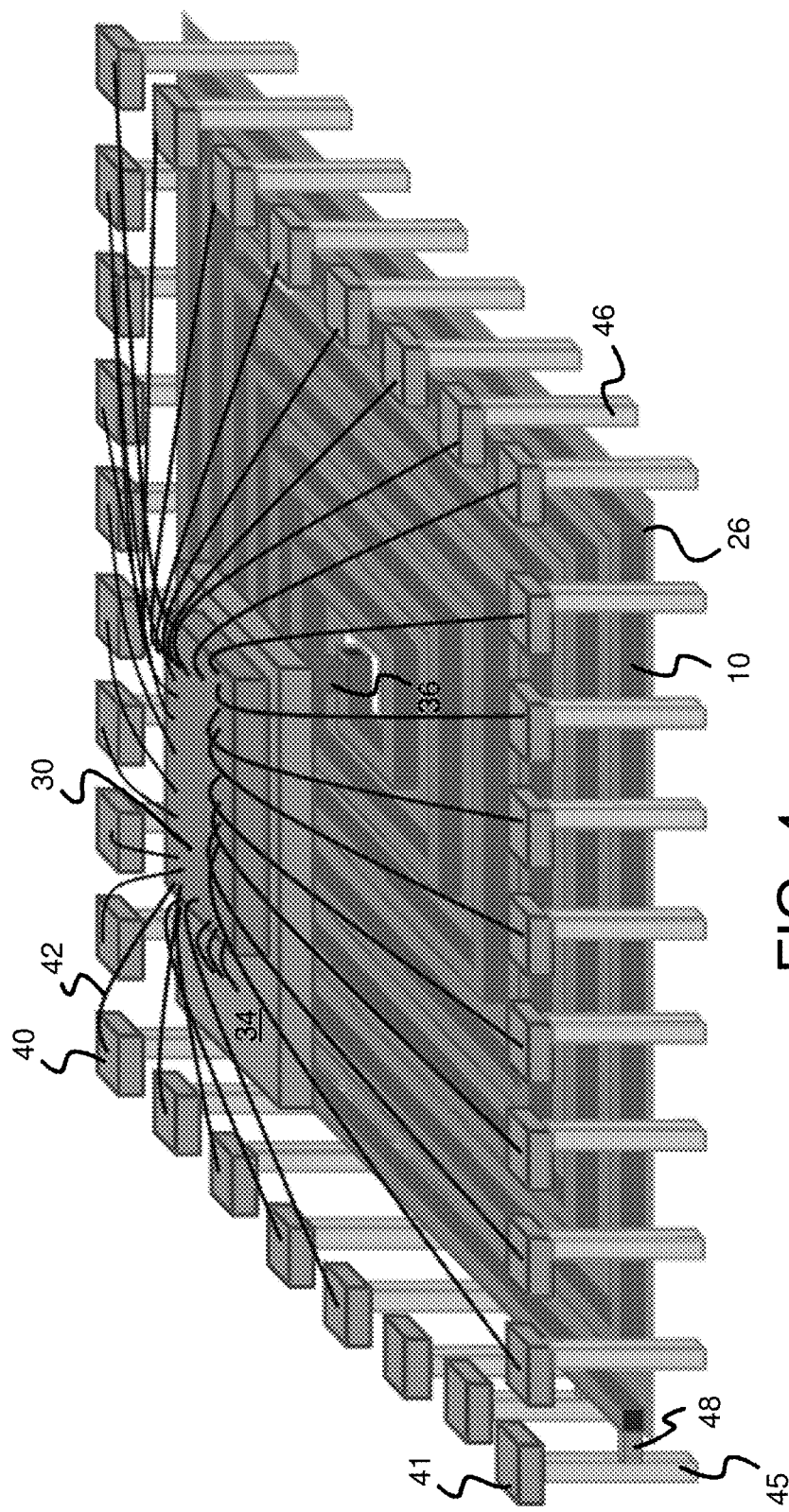
FIG. 4 is a 3D diagram of a shielded-inductor semiconductor package with the upper ferrite-dielectric shield removed to show the inductor coil.

FIG. 4 is a 3D diagram of a shielded-inductor semiconductor package with the upper ferrite-dielectric shield removed to show the inductor coil. In FIG. 4, upper ferrite-dielectric shield 24 has been removed. Inductor coil 10 is a planar coil that coils outward from center post 36 at its center, which electrically connects die attach pad 34 to the center winding of inductor coil 10. The outer-most winding of inductor coil 10 connects to lead-frame outer risers 45 through coil extension 48.

Most bonding pads on semiconductor chip 30 make electrical connection to package pins at the end of lead-frame risers 46 through bonding wires 42 and lead-frame pads 40. However, three bonding pads of semiconductor chip 30 have bonding wires that connect to the top surface of die attach pad 34. Electrical connection is then made from the top surface of die attach pad 34 to the bottom surface of die attach pad 34 and to center post 36. Die attach pad 34 could be conductive or metal traces and vias or through-holes in die attach pad 34 could make the electrical connection from semiconductor chip 30 to center post 36. Electrical connection is thus made from semiconductor chip 30 to the central winding of inductor coil 10. The outer winding of inductor coil 10 connects through coil extension 48 to lead-frame outer risers 45 which have lead-frame pads 41 on top and connect on the bottom to external package pins. Lead-frame pads 41 do not receive a bonding wire 42 from semiconductor chip 30.

Thus a series inductance is provided by inductor coil 10 between three bonding pads of semiconductor chip 30 and the external package pins. When a varying current flows through inductor coil 10, the electromagnetic field generated is shielded from causing EMI in semiconductor chip 30 by upper ferrite-dielectric shield 24 (FIG. 3).

Figure 5:
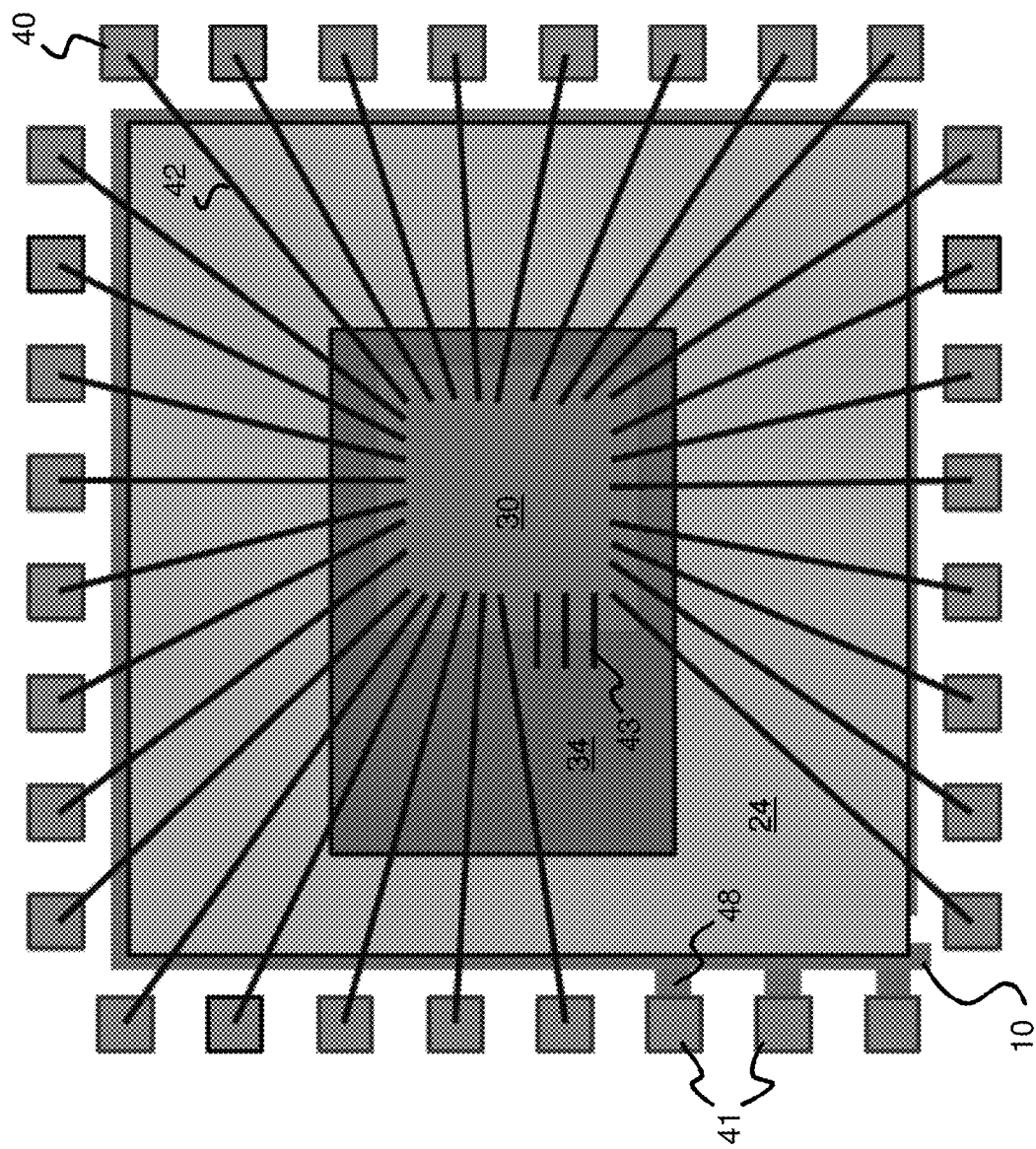
FIG. 5 is a top view of the shielded-inductor semiconductor package of FIG. 3.

FIG. 5 is a top view of the shielded-inductor semiconductor package of FIG. 3. Semiconductor chip 30 is attached to the top of die attach pad 34 and is electrically connected to lead-frame pads 40 by bonding wires 42. Lead-frame risers 46 are hidden by lead-frame pads 40 in this top view.

Most of inductor coil 10 is hidden from view by upper ferrite-dielectric shield 24 that sits between die attach pad 34 and inductor coil 10 and provides an EMI shield to semiconductor chip 30. However, part of the outer winding of inductor coil 10 is visible. The end of the outer winding of inductor coil 10 is connected by coil extension 48 to lead-frame outer risers 45 (not shown) and then to lead-frame pads 41. The inner winding of inductor coil 10 connects to the underside of die attach pad 34 and then through bonding wires 43 to semiconductor chip 30.

Figure 6:
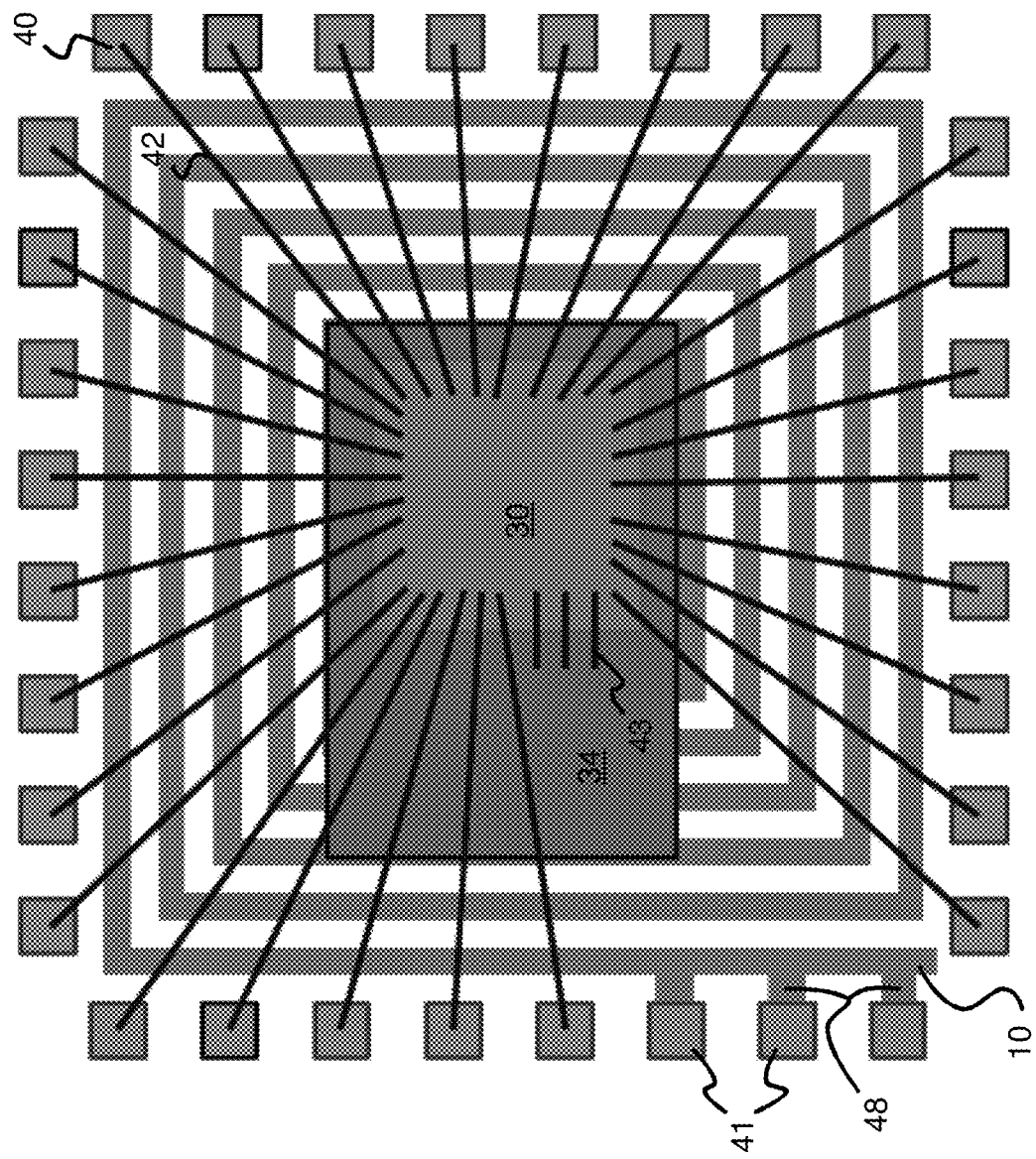
FIG. 6 is a top view of the shielded-inductor semiconductor package of FIG. 3.

FIG. 6 is a top view of the shielded-inductor semiconductor package of FIG. 3 with the upper ferrite-dielectric shield removed to show the inductor coil. Inductor coil 10 coils outward from its center, which is hidden by semiconductor chip 30 and die attach pad 34, to its outermost winding. The end of the outer winding of inductor coil 10 is connected by coil extension 48 to lead-frame outer risers 45 (not shown) and then to lead-frame pads 41.

Figure 7:
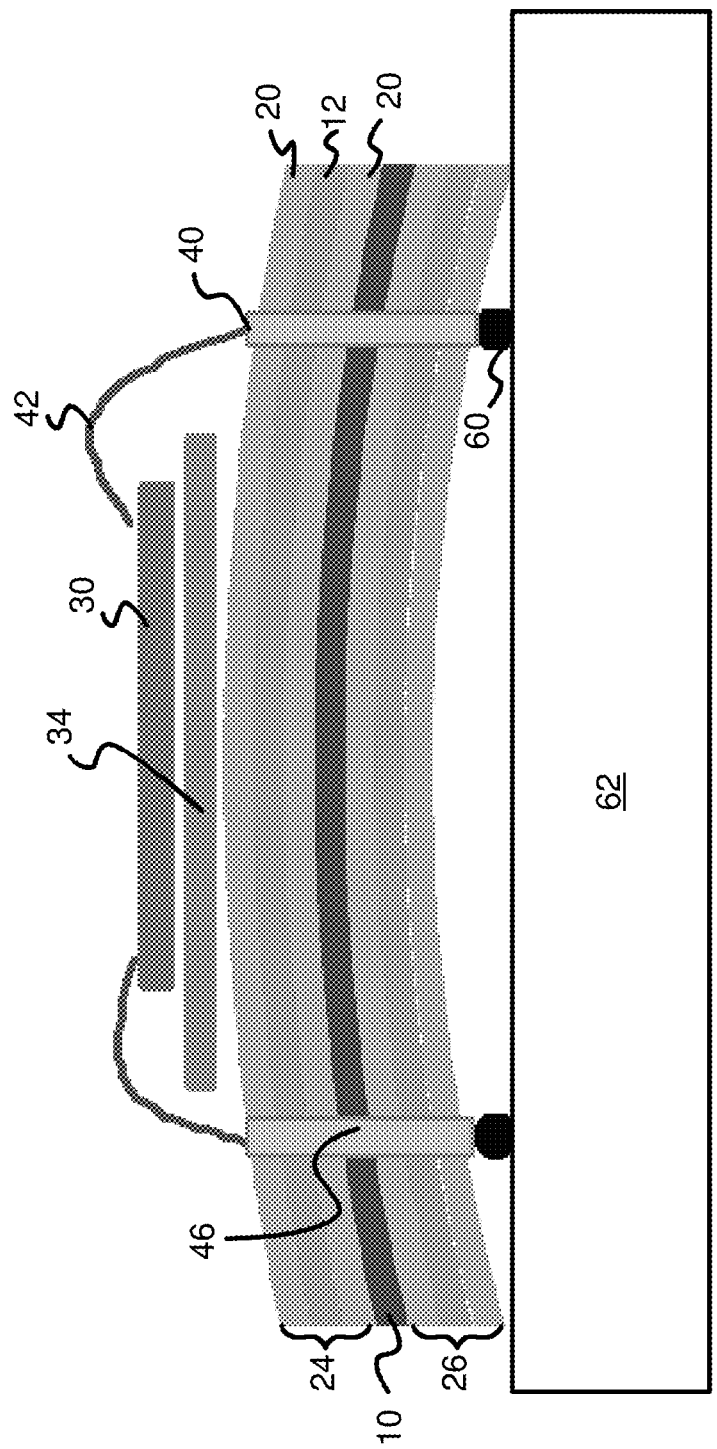
FIG. 7 is a cross-section of the shielded-inductor semiconductor package mounted to a PCB using surface-mount bonding balls.

FIG. 7 is a cross-section of the shielded-inductor semiconductor package mounted to a PCB using surface-mount bonding balls. Inductor coil 10 is sandwiched between upper ferrite-dielectric shield 24 and lower ferrite-dielectric shield 26 and forms a flexible laminate that can be bent. The coils within inductor coil 10 can move up or down relative to the plane since inductor coil 10 is not a continuous sheet of metal but is formed into a coil of metal windings. Upper ferrite-dielectric shield 24 and lower ferrite-dielectric shield 26 each contain ferrite layer 12 surrounded by dielectric laminate layers 20. Dielectric laminate layers 20 prevent shorting of ferrite layer 12 to inductor coil 10. FIG. 7 shows a maximum flex or curvature of inductor coil 10.

Semiconductor chip 30 on die attach pad 34 is connected to lead-frame pads 40 at the tops of lead-frame risers 46 by bonding wires 42. The tops of lead-frame risers 46 can function as lead-frame pads 40 in this embodiment. Semiconductor chip 30 is mounted to die attach pad 34 which sits over the top of upper ferrite-dielectric shield 24. Ferrite layer 12 blocks magnetic flux generated by inductor coil 10 from reaching semiconductor chip 30 and causing EMI.

The bottom of lead-frame risers 46 have bonding balls 60 attached, which can be solder balls that form a solder bond to surface-mount pads on PCB 62 when heated. Plastic encapsulant (not shown) can encapsulate semiconductor chip 30 and protect bonding wires 42.

Figure 8:
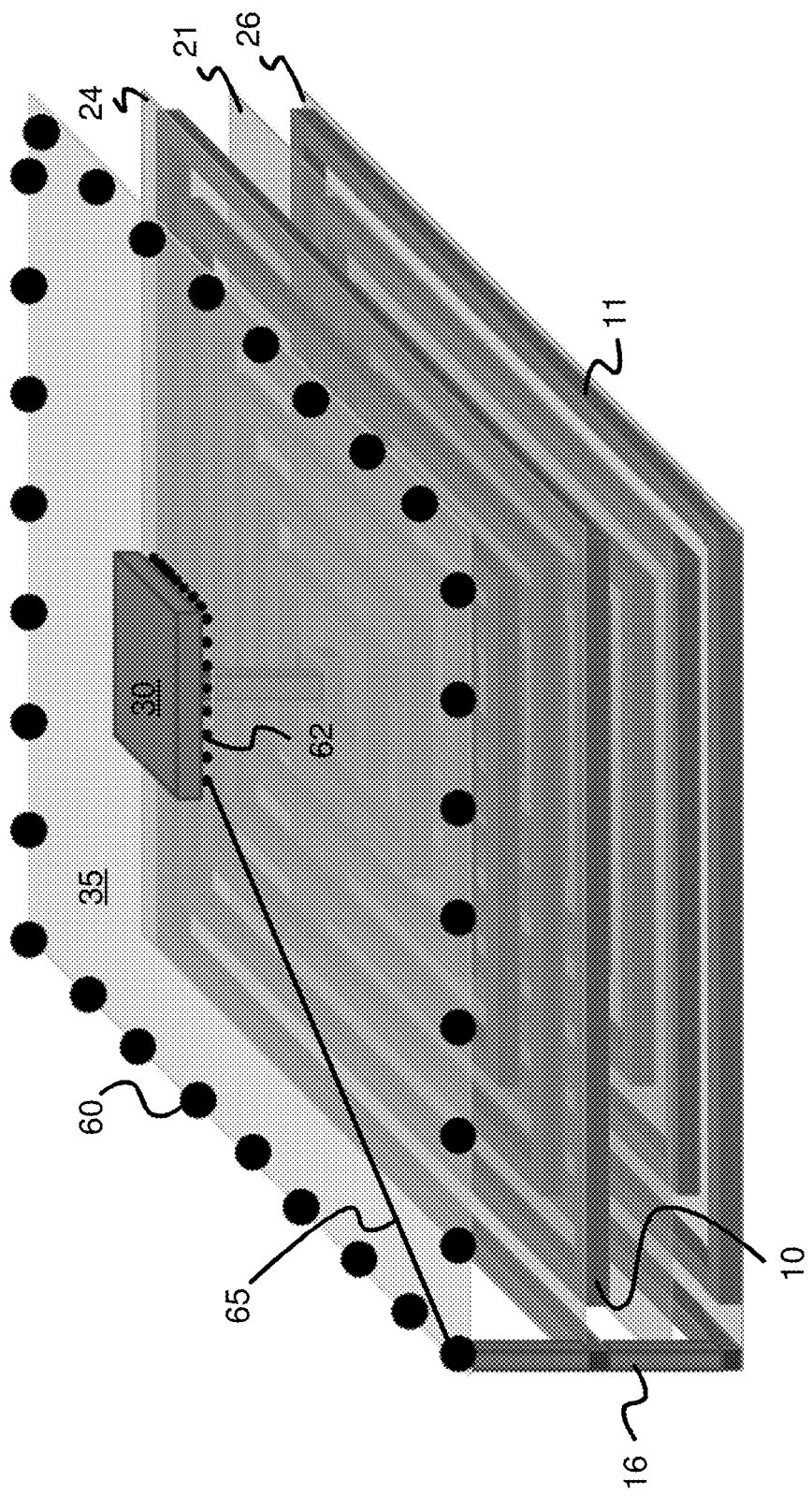
FIG. 8 is an alternative flip-chip shielded-inductor semiconductor package with bonding balls.

FIG. 8 is an alternative flip-chip shielded-inductor semiconductor package with bonding balls. Semiconductor chip 30 is a surface-mount die that is flipped and attached to the top of package substrate 35 by bonding balls 62. Metal traces patterned on package substrate 35 connect chip bonding balls 62 to larger external bonding balls 60 that connect the shielded-inductor semiconductor package to a system PCB.

Also in this variation, there are two inductor coils 10, 11 that are separated by dielectric laminate layer 21. Upper ferrite-dielectric shield 24 shields the top of inductor coil 10, while lower ferrite-dielectric shield 26 shields the bottom of inductor coil 11. The air core 14 the center of inductor coil 10 is aligned with the air core in the center of inductor coil 11. Coil riser 16 connects the outer winding of upper inductor coil 10 and lower inductor coil 11. Coil riser 16 can extend upward to package substrate 35 and then to bonding balls 60 or to semiconductor chip 30. Bonding wire 65 can be added to connect one of chip bonding balls 62 on semiconductor chip 30 to bonding ball 60 that connects to coil riser 16 at the outer end of inductor coil 10.

Figure 9:
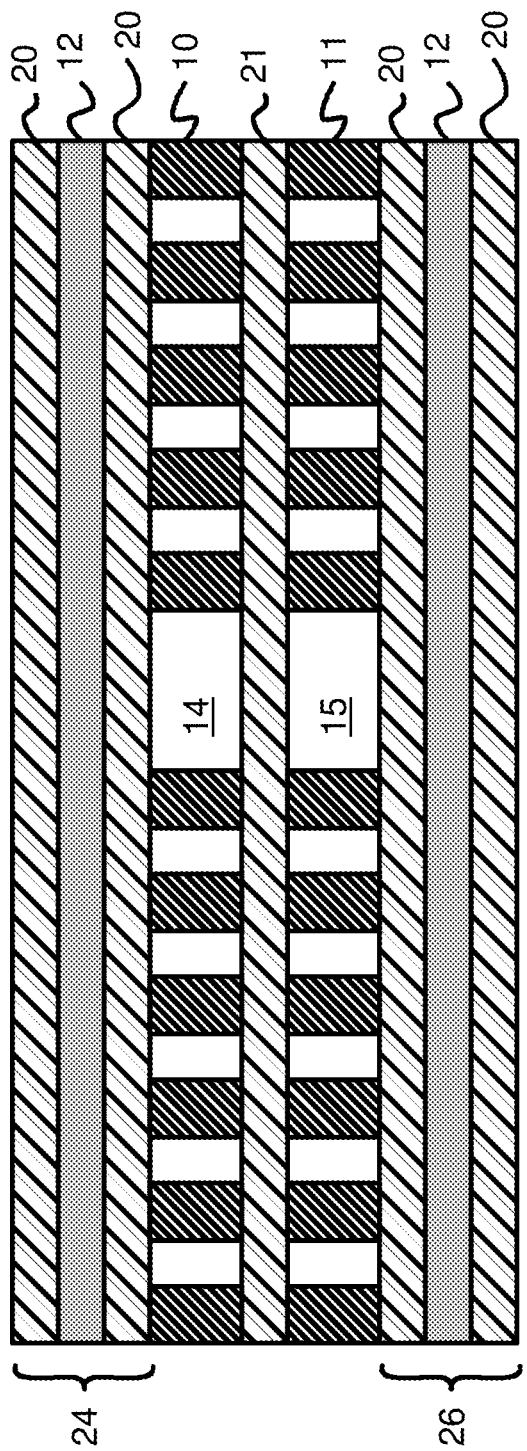
FIG. 9 is a cross section of an alternative shielded-inductor semiconductor package with two coils.

FIG. 9 is a cross section of an alternative shielded-inductor semiconductor package with two coils. In this variation, there are two inductor coils 10, 11 that are separated by dielectric laminate layer 21. Upper ferrite-dielectric shield 24 shields the top of inductor coil 10, while lower ferrite-dielectric shield 26 shields the bottom of inductor coil 11. Air core 14 in the center of inductor coil 10 is aligned with air core 15 in the center of inductor coil 11. Semiconductor chip 30 (not shown) can be placed either above upper ferrite-dielectric shield 24 or below lower ferrite-dielectric shield 26.

Figure 10:
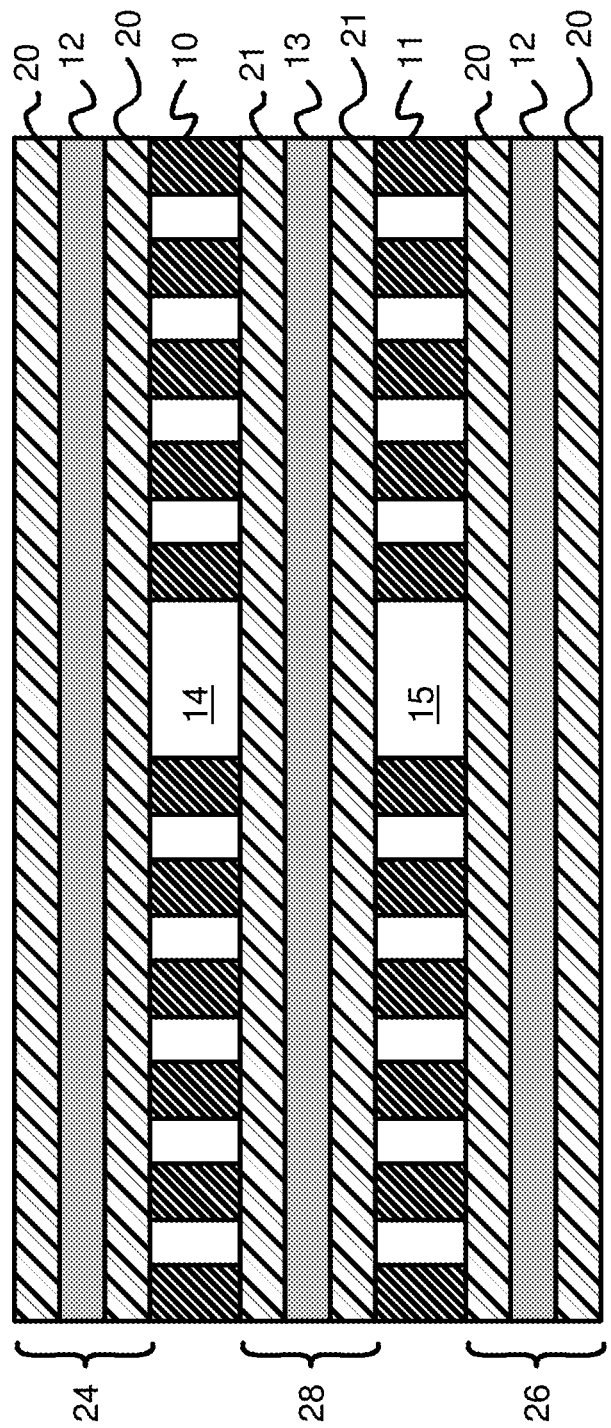
FIG. 10 is a cross section of another alternative shielded-inductor semiconductor package with two coils.

FIG. 10 is a cross section of another alternative shielded-inductor semiconductor package with two coils. In this variation, the two inductor coils 10, 11 are separated by middle ferrite-dielectric shield 28 which has dielectric laminate layers 21 surrounding ferrite layer 13. In this variation, inductor coil 10 is shielded from inductor coil 11 by ferrite layer 13. Also, the inductances of inductor coils 10, 11 can be increased by the addition of ferrite layer 13.

Figure 11:
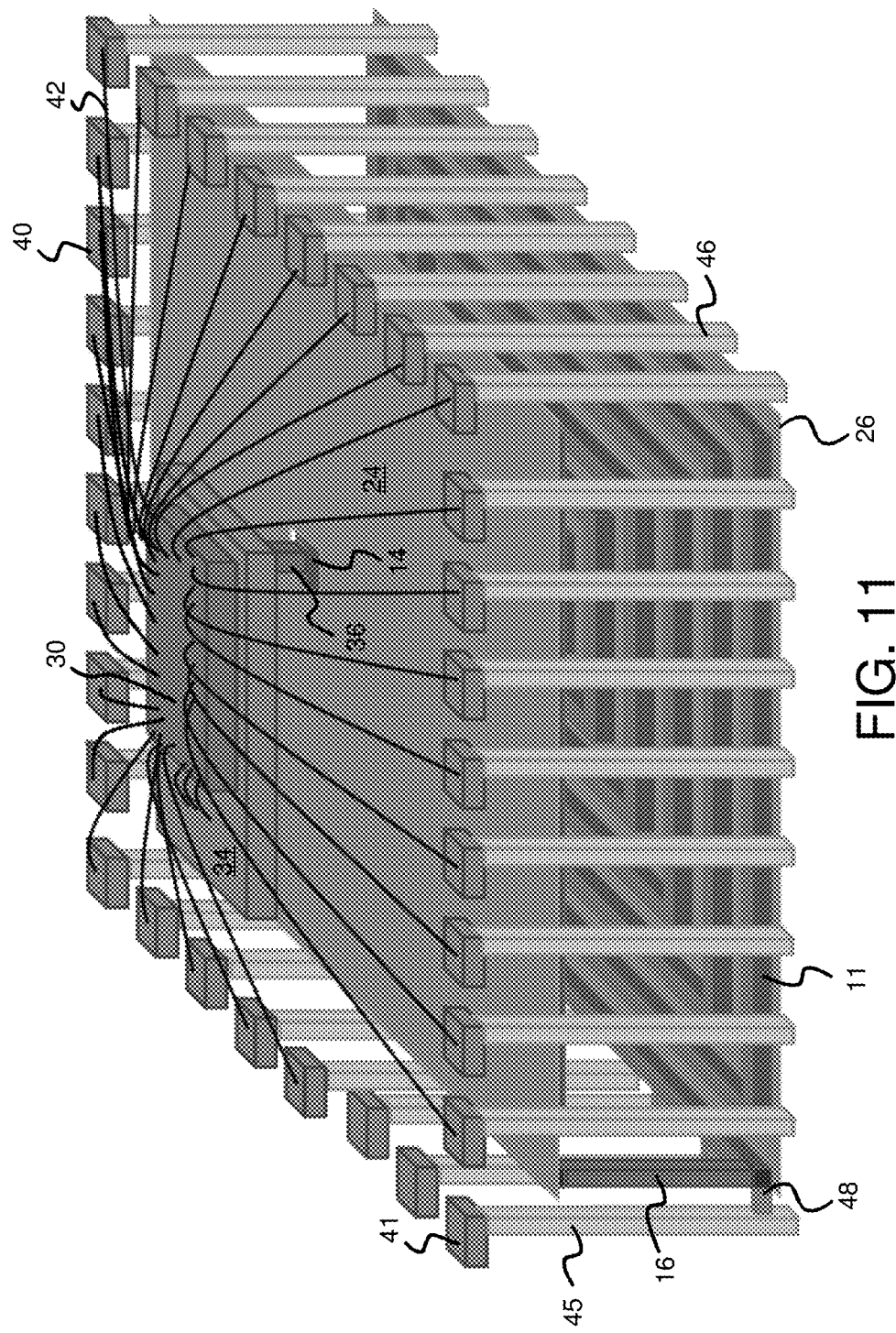
FIG. 11 is a 3D diagram of a dual-coil shielded-inductor semiconductor package.

FIG. 11 is a 3D diagram of a dual-coil shielded-inductor semiconductor package. In this embodiment there are two layers of coils, upper inductor coil 10 and lower inductor coil 11. There may be dielectric laminate layer 21 (not shown) between inductor coils 10, 11, as shown in FIG. 9, or middle ferrite-dielectric shield 28 (not shown), as shown in FIG. 10. The spacing between inductor coils 10, 11 is expanded in FIGS. 11, 12 to allow for better viewing, but would be much closer such as shown in FIGS. 9-10. Thus a relatively flat, low-profile package can be obtained, even when there are two layers of inductor coils 10, 11.

Semiconductor chip 30 is attached to die attach pad 34 such as by epoxy or other bonding. Bonding wires 42 are routed between bonding pads on semiconductor chip 30 and lead-frame pads 40. A few bonding wires are routed from bonding pads on semiconductor chip 30 to die attach pad 34.

Lead-frame pads 40 sit atop lead-frame risers 46 that connect to package pins that protrude out the bottom of the package and can fit in holes in a PCB when being soldered to the PCB of the larger system. Lead-frame risers 45, 46 may be bent or connect to other parts of the lead frame (not shown) that lead to the external package pins, bonding balls, or other external connectors (not shown).

Lead-frame risers 45, 46 form a rectangle that surrounds semiconductor chip 30, die attach pad 34, and inductor coil 10, which is mostly hidden from view by upper ferrite-dielectric shield 24. Inductor coil 10 is covered on the top by upper ferrite-dielectric shield 24.

Lower inductor coil 11 is visible although upper inductor coil 10 is mostly covered by upper ferrite-dielectric shield 24. Lower ferrite-dielectric shield 26 is attached to the bottom of lower inductor coil 11. Coil riser 16 connects the outer winding of upper inductor coil 10 and lower inductor coil 11.

The bottom of die attach pad 34 is connected to center post 36 that fits through a central opening in upper ferrite-dielectric shield 24 near air core 14. This opening in upper ferrite-dielectric shield 24 allows center post 36 to connect die attach pad 34 to the central winding of inductor coil 10. Center post 36 can extend downward and connect to the central winding of both upper inductor coil 10 and lower inductor coil 11 when inductor coil 10, 11 are in a parallel electrical connection.

Figure 12:
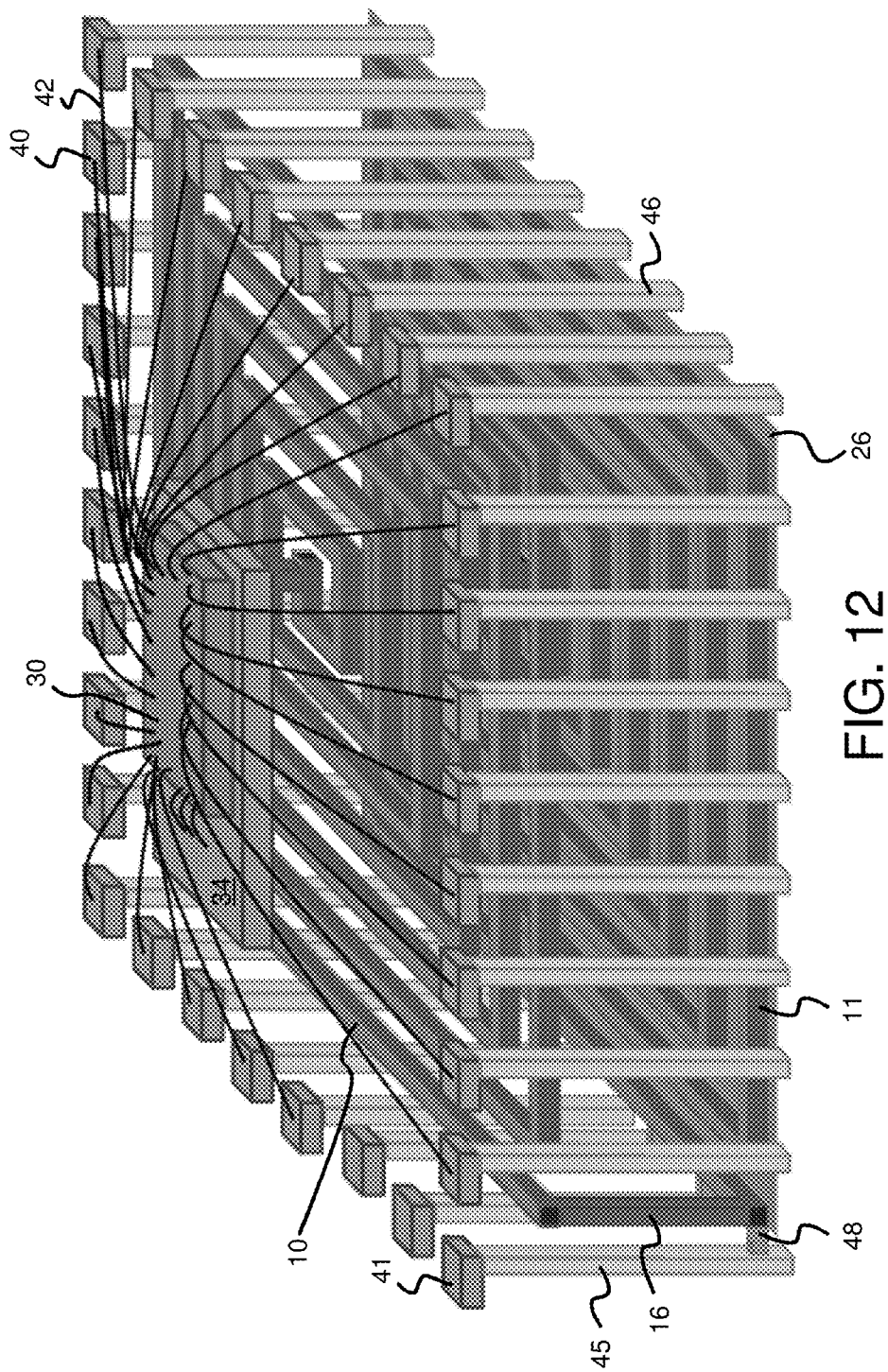
FIG. 12 is a 3D diagram of a dual-coil-layer shielded-inductor semiconductor package with the upper ferrite-dielectric shield removed to better show the inductor coils.

FIG. 12 is a 3D diagram of a dual-coil-layer shielded-inductor semiconductor package with the upper ferrite-dielectric shield removed to better show the inductor coils.

In FIG. 12, upper ferrite-dielectric shield 24 of FIG. 11 has been removed. Inductor coil 10 is a planar coil that coils outward from center post 36 at its center, which electrically connects die attach pad 34 to the center winding of inductor coil 10. The outer-most winding of upper inductor coil 10 connects to coil riser 16 and to the outer-most winding of lower inductor coil 11. Coil riser 16 is shorter than lead-frame risers 46.

Most bonding pads on semiconductor chip 30 make electrical connection to package pins at the end of lead-frame risers 46 through bonding wires 42 and lead-frame pads 40. However, three bonding pads of semiconductor chip 30 have bonding wires that connect to the top surface of die attach pad 34. Electrical connection is then made from the top surface of die attach pad 34 to the bottom surface of die attach pad 34 and to center post 36.

Electrical connection is thus made from semiconductor chip 30 to the central winding of upper inductor coil 10 and to the central winding of lower inductor coil 11 when center post 36 is extended downward (not shown). The outer winding of upper inductor coil 10 and of lower inductor coil 11 connect through coil extension 48 to lead-frame outer risers 45 which have lead-frame pads 41 on top and connect on the bottom to external package pins. Lead-frame pads 41 do not receive a bonding wire 42 from semiconductor chip 30 but instead connect to inductor coil 10 through coil extension 48. Lead-frame pads 41 serve no function other than for package symmetry and could be deleted.

Thus a parallel inductance is provided by upper inductor coil 10 and lower inductor coil 11 between three bonding pads of semiconductor chip 30 and the external package pins. When a varying current flows through inductor coils 10, 11, the electromagnetic field generated is shielded from causing EMI in semiconductor chip 30 by upper ferrite-dielectric shield 24 (FIG. 11).

Figure 13:
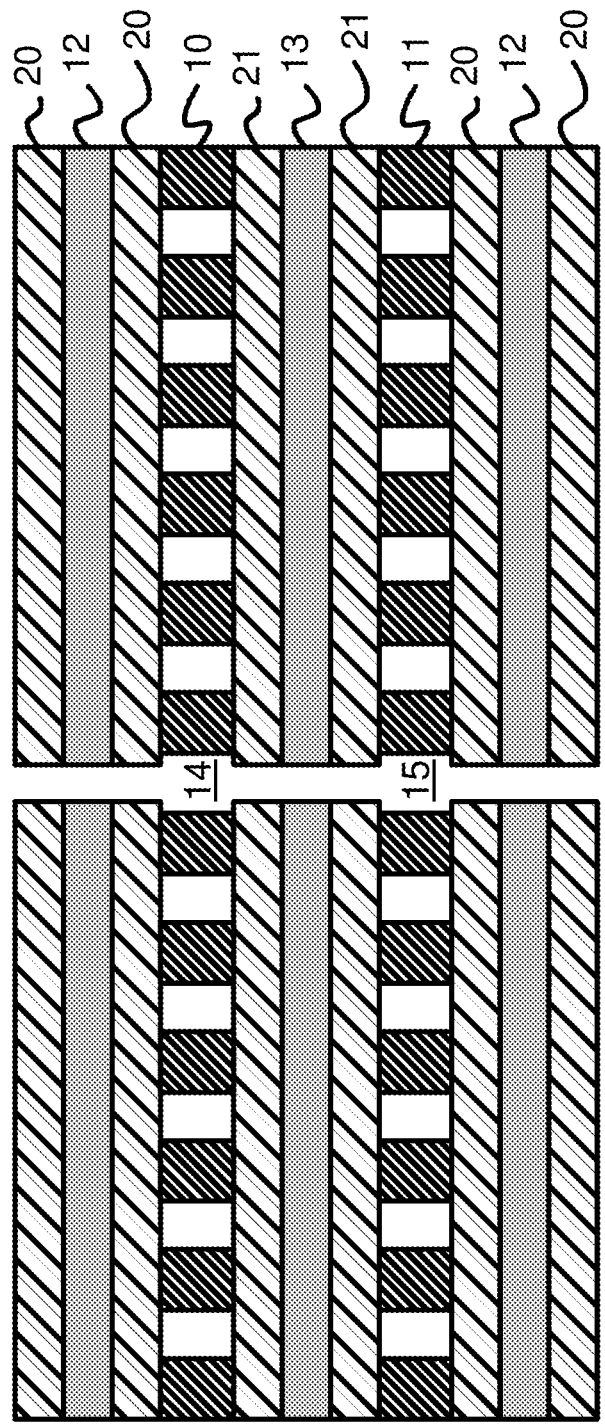
FIG. 13 is a cross section of still another alternative shielded-inductor semiconductor package with two coils.

FIG. 13 is a cross section of still another alternative shielded-inductor semiconductor package with two coils. In this variation, as in FIG. 10, the two inductor coils 10, 11 are separated by middle ferrite-dielectric shield 28 which has dielectric laminate layers 21 surrounding ferrite layer 13. In this variation, air core 14 and air core 15 are connected together by a larger hole that extends through ferrite layers 12, 13 and dielectric laminate layers 20, 21. Although there is an opening in ferrite layer 12 that magnetic flux might leak out of and cause EMI in semiconductor chip 30, this opening is relatively small and is in the middle of the coils so leakage is small. The larger hole provides more space for connecting the coils 10, 11. The central opening allows center post 36 to fit through ferrite layer 12 and dielectric laminate layers 20 between semiconductor chip 30 and inductor coil 10.

Alternate Embodiments

Several other embodiments are contemplated by the inventors. For example, the semiconductor chip could be a silicon chip such as a standard CMOS chip, or could be Silicon on another substrate, or other materials such as GaAs. More than one semiconductor chip 30 could be present and more than one inductor. Other packaging technologies could be substituted that use a lead frame or something similar, or are leadless.

Semiconductor chip 30 is an Integrated Circuit (IC) or discrete component such as a MOSFET and can be of various types such as Complementary Metal-Oxide-Semiconductor (CMOS) or BiCMOS. A typical IC has thousands of transistors formed together in semiconductor materials on a substrate that are connected by integrated wiring such as metal traces. Power IC's may have larger but fewer transistors, such as only 10 transistors. Semiconductor chip 30 could have power transistors for a power converter such as a Switched-Mode Power Supply (SMPS).

While pins and balls have been described for mounting the shielded-inductor semiconductor package to a PCB system board, many variations are possible. The pins may be leads, bent leads, or bent pins, flat surface-mount pads, and could be mounted into holes in the PCB or to pads on the PCB surface.

While the external package pins have been described as being placed around the perimeter of the shielded-inductor semiconductor package, some or all of these pins, balls, or connectors could be in a grid or array, such as in a Ball Grid Array (BGA) package.

While a plastic-encapsulated package has been described, the shielded-inductor semiconductor package could be a ceramic package or a hybrid package. The PCB may be rigid or flexible and may be some other kind of substrate or larger module or holder or frame in the system.

While inductor coil 10 has been shown as extending past upper ferrite-dielectric shield 24 in FIG. 5, upper ferrite-dielectric shield 24 could fully cover inductor coil 10. Upper ferrite-dielectric shield 24 and lower ferrite-dielectric shield 26 could both extend beyond inductor coil 10 and be squished or pinched together to touch each other to seal the perimeter edges of inductor coil 10.

While a parallel connection of inductor coil 10, 11 has been shown in FIG. 11, upper inductor coil 10 and lower inductor coil 11 could be placed in a series connection using additional lead frame elements or posts that connect the outer winding of upper inductor coil 10 to the center winding of lower inductor coil 11. Then coil riser 16 can be deleted and the outer winding of lower inductor coil 11 connects to lead-frame outer risers 45 for an external connection.

Rather than an external connection from inductor coil 10 using lead-frame outer risers 45, an internal connection within the package could be made from the outer winding of inductor coil 10 back to one of lead-frame risers 46 that does not have an external connection, through bonding wires 42 to a bonding pad on semiconductor chip 30. Other internal connections are possible.

Inductor coil 10 is considered to be an air-core inductor since air core 14 at the center of the planar coil does not have ferrite, even though ferrite layer 12 is above and below the plane of inductor coil 10, increasing the inductance of the coil as would a ferrite core. Center post 36 may be within the air core in the center of inductor coil 10. Since center post 36 is connected to inductor coil 10, it is not considered to be a metal core of inductor coil 10.

Inductor coil 10 is a metal coil and connects to semiconductor chip 30 through center post 36 and die attach pad 34, and on the other end connects to an external package pin through lead-frame outer risers 45, so inductor coil 10 can be considered to be part of the lead frame of the package, along with lead-frame pads 40 and lead-frame risers 46. Thus, inductor coil 10 is integrated with the package lead frame.

EMI generated by current passing through inductor coil 10 and received by metal traces or other components on semiconductor chip 30 is reduced by at least 90% by using ferrite layer 12. The electromagnetic flux is blocked by ferrite layer 12 that is placed between inductor coil 10 and semiconductor chip 30. Dielectric laminate layers 20 prevent shorting of inductor coil 10 to semiconductor chip 30 or to other conductors.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A semiconductor package with an integrated and shielded lead-frame inductor comprising:
    a semiconductor chip having transistors formed in a semiconductor material and having integrated wiring integrated together on a chip substrate;
    chip bonding pads connected to the integrated wiring and formed on a perimeter of the chip substrate;
    an inductor coil having an air core, the inductor coil being a planar inductor that is substantially in a plane of the inductor coil, the plane of the inductor coil being parallel to a plane of the semiconductor chip;
    an upper ferrite-dielectric shield having a ferrite layer and a dielectric layer above the ferrite layer and a dielectric layer below the ferrite layer, the inductor coil being electrically isolated from the ferrite layer by the dielectric layer;
    wherein the upper ferrite-dielectric shield is in a plane parallel to and between the plane of the inductor coil and the plane of the semiconductor chip;
    a plurality of lead-frame pads placed around a perimeter of the inductor coil and surrounding the semiconductor chip;
    bonding wires that connect the chip bonding pads on the semiconductor chip to the plurality of lead-frame pads;
    a plurality of lead-frame risers that connect the plurality of lead-frame pads to package pins for electrically connecting to an external system;
    a center post that connects to an inner end of the inductor coil and is electrically connected to the semiconductor chip; and
    a lead-frame outer riser that connects an outer end of the inductor coil to a package pin for electrically connecting to the external system.

2. The semiconductor package with the integrated and shielded lead-frame inductor of claim 1 wherein current flowing through the inductor coil between the inner end and the outer end of the inductor coil generates electromagnetic flux that is at least 90% shielded from the semiconductor chip by the ferrite layer;
    whereby the ferrite layer reduces Electro-Magnetic Interference (EMI) generated by the inductor coil and received by the semiconductor chip by at least 90%.

3. The semiconductor package with the integrated and shielded lead-frame inductor of claim 2 wherein the plurality of lead-frame risers pass through the plane of the inductor coil outside of the perimeter of the inductor coil.

4. The semiconductor package with the integrated and shielded lead-frame inductor of claim 3 further comprising:
    a lower ferrite-dielectric shield having a ferrite layer and a dielectric laminate layer above the ferrite layer and a dielectric laminate layer below the ferrite layer, the inductor coil being electrically isolated from the ferrite layer by the dielectric laminate layer;
    wherein the lower ferrite-dielectric shield is in a lower plane parallel to and below the plane of the inductor coil and the plane of the semiconductor chip.

5. The semiconductor package with the integrated and shielded lead-frame inductor of claim 4 further comprising:
    a die attach pad that a bottom of the semiconductor chip is attached to;
    wherein the center post electrically connects to the semiconductor chip through the die attach pad.

6. The semiconductor package with the integrated and shielded lead-frame inductor of claim 5 further comprising:
    bonding wires from chip bonding pads to the die attach pad to make electrical connection from the semiconductor chip to the die attach pad and through the center post to the center end of the inductor coil.

7. The semiconductor package with the integrated and shielded lead-frame inductor of claim 6 wherein the package pins comprise bonding balls for soldering to pads on a Printed Circuit Board (PCB).

8. The semiconductor package with the integrated and shielded lead-frame inductor of claim 7 further comprising:
    an encapsulant that is placed around and between the bonding wires and to encapsulate the semiconductor chip.

9. The semiconductor package with the integrated and shielded lead-frame inductor of claim 6 wherein the air core is in a center of the inductor coil, wherein the center post fits through a hole in the upper ferrite-dielectric shield above the air core to connect the semiconductor chip to the inner end of the inductor coil,
    wherein the inductor coil is an air-core inductor.

10. The semiconductor package with the integrated and shielded lead-frame inductor of claim 9 further comprising:
    a second inductor coil having an air core, the second inductor coil being a second planar inductor that is substantially in a second plane of the second inductor coil, the second plane of the second inductor coil being parallel to a plane of the semiconductor chip;

a second dielectric layer for electronically isolating the inductor coil from the second inductor coil, the second dielectric layer being between the inductor coil and the second inductor coil;

wherein the plurality of lead-frame pads is placed around a perimeter of the second inductor coil.

11. The semiconductor package with the integrated and shielded lead-frame inductor of claim 10 further comprising:
a second upper ferrite-dielectric shield having a second ferrite layer and the second dielectric layer above the second ferrite layer and a third dielectric layer below the second ferrite layer, the second inductor coil being electrically isolated from the second ferrite layer by the second dielectric layer;

wherein the second upper ferrite-dielectric shield is in a second plane parallel to and between the second plane of the second inductor coil and the plane of the semiconductor chip.

12. The semiconductor package with the integrated and shielded lead-frame inductor of claim 11 wherein the center post further extends downward from the inner end of the inductor coil to an inner end of the second inductor coil;

wherein the lead-frame outer riser further comprises a coil riser that connects to an outer end of the second inductor coil;

wherein the inductor coil and the second inductor coil are connected in parallel between the semiconductor chip and the lead-frame outer riser.

13. An Electro-Magnetic Interference (EMI)-shielded semiconductor-inductor package comprising:
a semiconductor chip having chip bonding pads that are connected to semiconductor transistors by interconnect layers all integrated together on a chip substrate;
a die attach pad that the semiconductor chip is mounted to;
an inductor coil situated underneath the die attach pad;
a first ferrite-dielectric shield situated between the inductor coil and the die attach pad for shielding the semiconductor chip from EMI generated by the inductor coil;

wherein the first ferrite-dielectric shield comprises a ferrite layer between an upper dielectric layer and a lower dielectric layer that electrically isolate the ferrite layer from the semiconductor chip;

an opening in the first ferrite-dielectric shield, the opening under the die attach pad, the opening situated over a center air core of the inductor coil, the inductor coil having a metal coil that coils outward from an inner end at the center air core to an outer end; and lead-frame risers situated around the inductor coil and around the semiconductor chip, each lead-frame riser having a top pad for receiving a bonding wire from a chip bonding pad on the semiconductor chip, each lead-frame riser having an external connector end for making electrical connection to an external system, whereby the ferrite layer shields the semiconductor chip from EMI generated by the inductor coil.

14. The EMI-shielded semiconductor-inductor package of claim 13 further comprising:
a center post passing through the opening in the first ferrite-dielectric shield to connect the die attach pad to the inner end of the inductor coil;

wherein the die attach pad further comprises an electrical connection from the semiconductor chip to the center post, whereby the semiconductor chip is electrically connected to the inner end of the inductor coil by the die attach pad and the center post.

15. The EMI-shielded semiconductor-inductor package of claim 14 further comprising:
a lead-frame outer riser connected to the outer end of the inductor coil, the lead-frame outer riser having an external connector end for making electrical connection to an external system, whereby the inductor coil is electrically connected between the semiconductor chip and the external connector end of the lead-frame outer riser.

16. The EMI-shielded semiconductor-inductor package of claim 15 further comprising:
a second ferrite-dielectric shield situated below the inductor coil;

wherein the second ferrite-dielectric shield comprises a ferrite layer between an upper dielectric layer and a lower dielectric layer that electrically isolate the ferrite layer.

17. The EMI-shielded semiconductor-inductor package of claim 13 wherein the inductor coil is flexible and bendable out of the plane of the inductor coil.

18. An Integrated Circuit (IC) package with an integrated, shielded inductor comprising:
an inductor coil having an air core, the inductor coil being a planar inductor situated in a coil plane;
an upper ferrite-dielectric shield situated above the inductor coil;
a lower ferrite-dielectric shield situated below the inductor coil;

wherein the upper ferrite-dielectric shield and the lower ferrite-dielectric shield each comprise a ferrite layer surrounded by an upper dielectric layer and a lower dielectric layer;

a package substrate for attaching to a semiconductor chip;
external package connectors for soldering the IC package to an external Printed Circuit Board (PCB);

wherein the ferrite layer shields the semiconductor chip from Electro-Magnetic Interference (EMI) generated by currents passing through the inductor coil.

19. The IC package of claim 18 wherein the external package connectors comprise bonding balls on the package substrate for making external connections.

20. The IC package of claim 18 wherein the semiconductor chip is surface-mounted to the package substrate.

* * * * *